United States Patent
Hong

(10) Patent No.: US 11,049,583 B2
(45) Date of Patent: Jun. 29, 2021

(54) SEMICONDUCTOR SYSTEM WITH A TRAINING OPERATION

(71) Applicant: SK hynix Inc., Icheon-si (KR)

(72) Inventor: Gi Moon Hong, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/587,458

(22) Filed: Sep. 30, 2019

(65) Prior Publication Data

US 2020/0202969 A1 Jun. 25, 2020

(30) Foreign Application Priority Data

Dec. 24, 2018 (KR) .................. 10-2018-0168424

(51) Int. Cl.
| | |
|---|---|
| *G11C 29/14* | (2006.01) |
| *G11C 29/38* | (2006.01) |
| *G06F 13/40* | (2006.01) |
| *G11C 29/12* | (2006.01) |

(52) U.S. Cl.
CPC .......... *G11C 29/14* (2013.01); *G06F 13/4022* (2013.01); *G11C 29/12015* (2013.01); *G11C 29/38* (2013.01)

(58) Field of Classification Search
CPC .................................. G11C 29/14; G11C 29/38
See application file for complete search history.

(56) References Cited

U.S. PATENT DOCUMENTS

| | | | |
|---|---|---|---|
| 6,829,728 B2 | 12/2004 | Cheng et al. | |
| 7,294,998 B2* | 11/2007 | Chiba | G01R 31/31922 324/750.01 |
| 8,683,164 B2 | 3/2014 | Jeddeloh | |
| 2003/0105999 A1 | 6/2003 | Koss et al. | |
| 2007/0058479 A1* | 3/2007 | Matsui | G11C 7/1066 365/189.18 |
| 2007/0234146 A1* | 10/2007 | Watanabe | G01R 31/31919 714/724 |
| 2008/0005493 A1 | 1/2008 | Chung et al. | |
| 2008/0244340 A1* | 10/2008 | Doi | G11C 29/81 714/711 |
| 2011/0218949 A1* | 9/2011 | Cho | G06N 20/00 706/12 |
| 2013/0069678 A1* | 3/2013 | Grosch | G01R 31/30 324/750.02 |
| 2014/0122922 A1* | 5/2014 | Hunt | G06F 11/073 714/6.11 |
| 2016/0314821 A1 | 10/2016 | Lu et al. | |
| 2017/0154688 A1* | 6/2017 | Kim | G11C 29/46 |

FOREIGN PATENT DOCUMENTS

KR 1020200078982 A 7/2020

* cited by examiner

*Primary Examiner* — Joseph D Torres
(74) *Attorney, Agent, or Firm* — William Park & Associates Ltd.

(57) ABSTRACT

A semiconductor system includes a slave and a master, wherein the slave includes a plurality of unit memory regions, and is configured to transmit determination result data generated by comparing reference data and test data, to the master, and wherein the master is configured to write the reference data and the test data in the plurality of unit memory regions.

19 Claims, 5 Drawing Sheets

SEMICONDUCTOR SYSTEM WITH A TRAINING OPERATION

CROSS-REFERENCES TO RELATED APPLICATION

The present application claims priority under 35 U.S.C. § 119(a) to Korean application number 10-2018-0168424, filed on Dec. 24, 2018, in the Korean Intellectual Property Office, which is incorporated herein by reference in its entirety.

BACKGROUND

1. Technical Field

Various embodiments generally relate to a semiconductor apparatus, and, more particularly, to a semiconductor system with a training operation.

2. Related Art

As the operation of a semiconductor system is speeds up, a training function for checking whether a slave (for example, a semiconductor memory) accurately receives a signal provided from a master (for example, a memory controller, a CPU or a GPU) is useful.

The training function may include a command training, a write training or/and a read training, and may selectively perform at least one among them.

The write training may be an operation in which the master transmits data of a preset pattern to the slave, the slave transmits the data transmitted from the master, back to the master, and the master determines the data transmitted from the slave, that is, determines whether it is a pass or a fail and detects the center of a data eye based on a result thereof.

SUMMARY

In an embodiment, a semiconductor system may include: a slave and a master, wherein the slave may include a plurality of unit memory regions, and may be configured to transmit determination result data generated by comparing reference data and test data, to the master, and wherein the master may be configured to write the reference data and the test data in the plurality of unit memory regions.

In an embodiment, a semiconductor system may include: a slave and a master, wherein the slave may include a plurality of unit memory regions and a pipe register for parallelizing data outputted from the plurality of unit memory regions, and may be configured to transmit determination result data generated by determining whether test data is a pass or not, through comparing reference data and the test data, and wherein the master may be configured to perform at least one of a first training operation of writing the reference data and the test data in the plurality of unit memory regions and detecting a center of a data eye of the determination result data and a second training operation of writing the test data in the pipe register, reading the test data and determining whether the read test data is a pass or not.

DETAILED DESCRIPTION

Hereinafter, a semiconductor system with a training function will be described below with reference to the accompanying drawings through various examples of embodiments.

Various embodiments may be directed to a semiconductor system with a training function, capable of shortening a training performance time and increasing the accuracy of a training operation.

Figure 1:
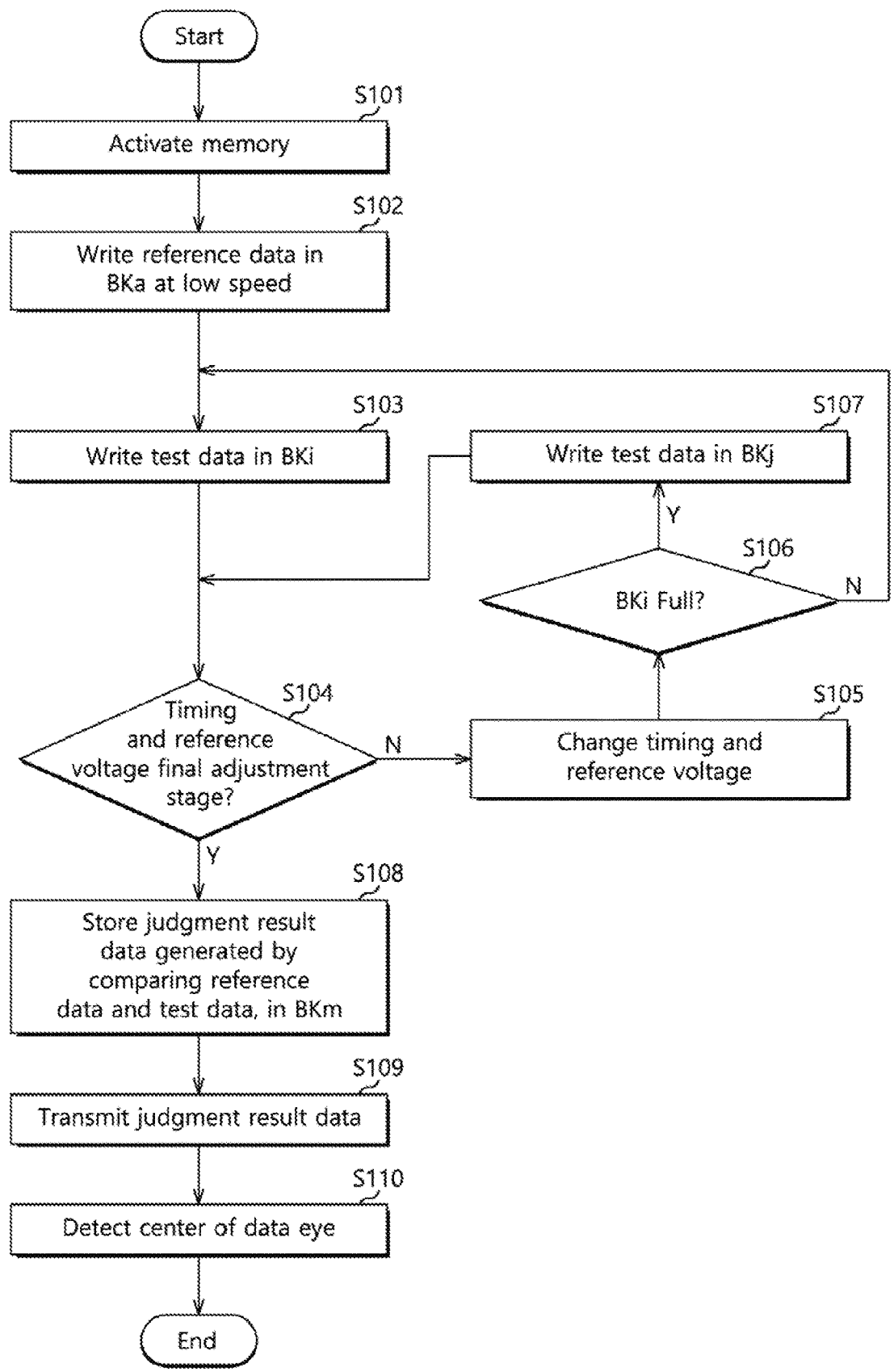
FIG. 1 is a representation of an example of a flow chart to assist in the explanation of a method for training a semiconductor system in accordance with an embodiment.

FIG. 1 is a representation of an example of a flow chart to assist in the explanation of a method for training a semiconductor system in accordance with an embodiment.

First, a training, for example, a write training operation, may be performed during an initialization period (for example, after a power-up or/and after an initial register setup) of a slave (for example, a semiconductor memory), after a refresh operation or/and in the case where a change in operation environment (temperature or voltage) has occurred.

Also, a training operation may be performed upon each request of a master (for example, a memory controller).

As illustrated in FIG. 1, the master provides a predetermined command (for example, an active command) to the slave such that a memory active operation is performed (S101). In an embodiment, the memory active operation may include activating the memory. The word "predetermined" as used herein with respect to a parameter, such as a predetermined command, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The master provides a predetermined command (for example, a write command) and an address, and thereby, writes, at a low speed, reference data in any one unit memory region of the memory selected among the memory banks of the slave, which corresponds to the address (S102). The unit memory region of the memory may comprises a memory bank (for example, a first memory bank BKa).

When compared to the step S102 for writing the reference data, an operation of transmitting or/and writing test data, that will be described below, is performed at a relatively higher speed.

Therefore, the low speed at the step S102 may be defined as meaning an operation that is performed at a relatively lower speed when compared to the operation speed of at least one of subsequent steps.

A probability of error occurrence in a data transmission process is relatively low in a low speed operation as compared with a high speed operation.

Since the step S102 is performed at a low speed, in particular, at such a speed as to prevent or mitigate the occurrence of a data transmission error, the reference data may be stably written in the memory bank BKa.

The master provides a predetermined command (for example, a write command) and an address, and thereby, writes data, that is, test data, in a second memory bank (for example, BKi) of the slave, which corresponds to the address (S103).

The master may transmit the test data at a high speed.

The high speed means a higher speed when compared to the low speed of the step S102. That is to say, the operation frequency of the step S103 may be higher than the operation frequency of the step S102.

The test data may include one or more data sets, and each of the one or more data sets may have a pattern (a bit number and a format) which the master knows in advance.

The master determines whether it is a final adjustment stage of adjusting a data transmission timing and a reference voltage (S104).

In the case where, as a determination result of the step S104, it is not a final adjustment stage of adjusting a data transmission timing and a reference voltage, the master changes a data transmission timing and a reference voltage (S105).

The master determines whether the memory bank BKi is in a full state, that is, whether there are extra memory cells in which data may be written, in the memory bank BKi (S106).

The master knows the storage capacity of the slave and the use information of the respective memory banks. Thus, the master may determine whether the corresponding memory bank BKi is in a full state due to the test data transmitted at the step S103.

If, as a determination result of the step S106, the memory bank BKi is not in a full state, the master writes test data in the memory bank BKi of the slave (S103).

On the other hand, if, as a determination result of the step S106, the memory bank BKi is in a full state, the master writes test data in another memory bank BKj of the slave (S107).

While the step S107 represents an example in which test data is written in another memory bank BKj of the slave when the memory bank BKi is in a full state, it is to be noted that, as the occasion demands (for example, in consideration of convenience of a training or convenience in the designation of a memory address), test data may be written in another memory bank BKj of the slave even when the memory bank BKi is not in a full state.

In the case where, as a determination result of the step S104, it is a final adjustment stage of adjusting a data transmission timing and a reference voltage, the master may notify the slave of the completion of test data writing.

The slave generates determination result data by determining a pass or a fail through comparing the reference data and the test data, and writes the generated determination result data in another memory bank (for example, a third memory bank BKm) (S108).

The slave may generate determination result data from after recognizing the completion of test data writing, or may perform an operation of generating determination result data subsequently from a time when test data is written, regardless of recognizing the completion of test data writing.

If writing of determination result data is completed, the slave transmits the determination result data written in the memory bank BKm, to the master (S109).

The master may perform a final training process, for example, an operation of detecting the center of the data eye of the determination result data transmitted from the slave (S110).

The master may store a data transmission timing and a reference voltage corresponding to the detected center of the data eye, and, by setting them as a reference value for a subsequent normal operation, may end the training operation.

The data transmission timing and the reference voltage corresponding to the center of the data eye are stored, of course, in the master, and may be set as an operation reference of the slave by being stored in a mode register or the like of the slave.

In an embodiment, after an initial training, a training is not performed in such a way as to change a data transmission timing and a reference voltage through total preset ranges, and by performing a training operation through setting a data transmission timing and a reference voltage corresponding to the center of a data eye detected in a previous training operation, as a start point, it may be possible to shorten a training time.

Meanwhile, the above-described method for training a semiconductor system in accordance with an embodiment only represents an example in which all test data necessary for a training operation are collectively written without an intermediate read process. However, it is to be noted that the method for training a semiconductor system in accordance with an embodiment may include a scheme of repeatedly performing writes and reads by dividing all test data necessary for a training operation. In this connection, the amount of divided test data may be larger than the total memory capacity of a pipe register which will be described later. The above-described scheme of repeatedly performing writes and reads by dividing all test data necessary for a training operation may be performed in consideration of a refresh operation of the semiconductor system. For instance, if a time required to collectively write all test data necessary for a training operation is within a data retention time, all the test data necessary for a training operation are collectively written, and if not, the scheme of repeatedly performing writes and reads by dividing all test data necessary for a training operation may be used.

Hereinbelow, an embodiment of a semiconductor system for realizing the training method in accordance with the embodiments described above with reference to FIG. 1 will be described.

Figure 2:
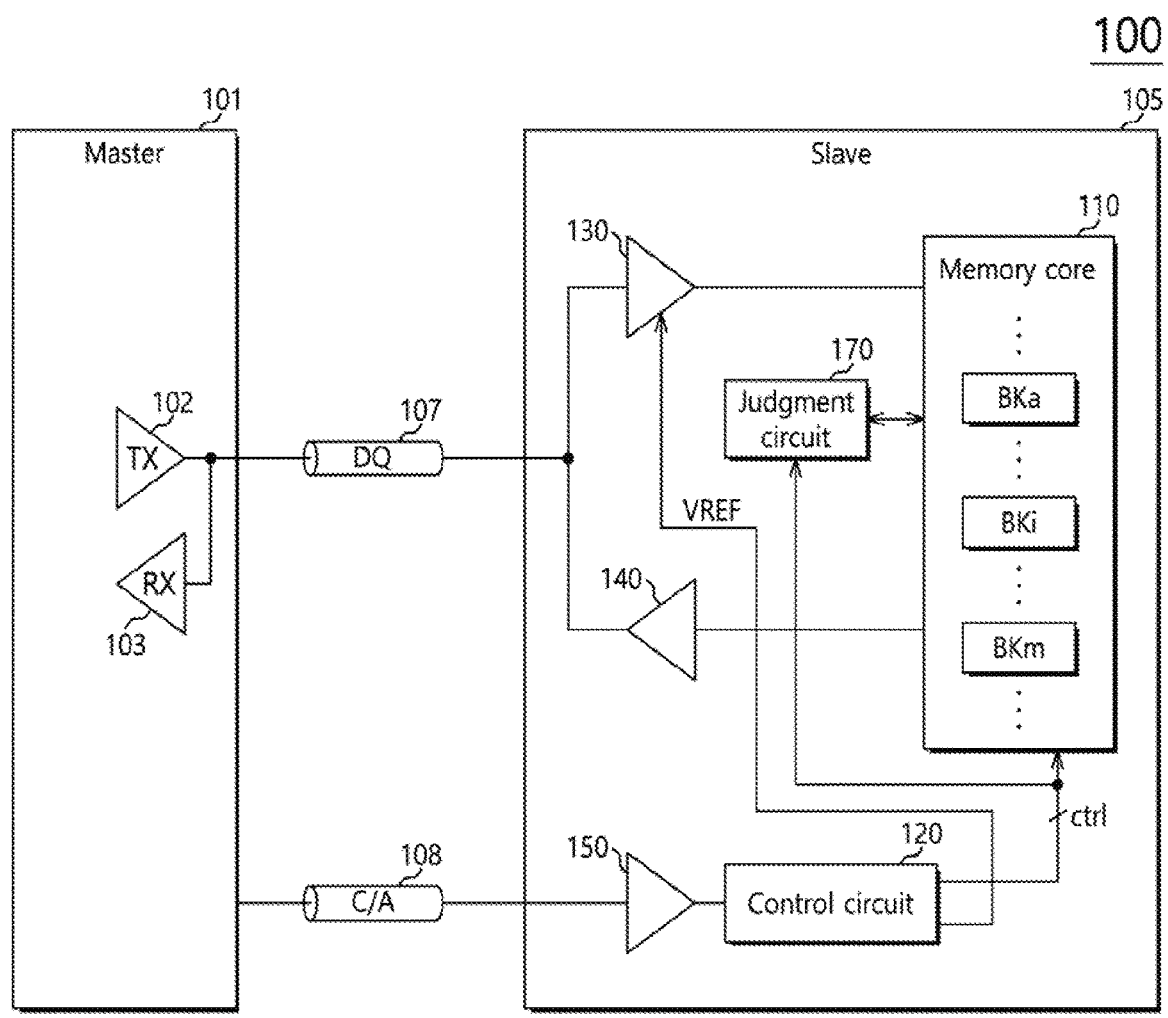
FIG. 2 is a diagram illustrating a representation of an example of the configuration of a semiconductor system in accordance with an embodiment.

FIG. 2 is a diagram illustrating a representation of an example of the configuration of a semiconductor system in accordance with an embodiment.

As shown in FIG. 2, a semiconductor system 100 in accordance with an embodiment may include a master 101 and a slave 105.

The master 101 may be configured to write reference data and test data in respective regions selected among a plurality of unit memory regions of the slave 105.

The master 101 may perform an operation of detecting the center of the data eye of determination result data provided from the slave 105.

The master 101 may include, for example, a memory controller such as a CPU or a GPU, and the slave 105 may include, for example, a semiconductor memory.

A data channel 107 and a command/address channel 108 may be coupled between the master 101 and the slave 105.

The master 101 and the slave 105 may transmit/receive data DQ through the data channel 107.

The master 101 may output test data stored therein through the data channel 107 for a training operation.

The master 101 may transmit a command/address C/A to the slave 105 through the command/address channel 108.

The master 101 may encode a command such as an active, write or read command, an address and an information for changing a reference voltage VREF, in the command/address C/A.

The master 101 may encode different information in the command/address C/A depending on an operation state of the semiconductor system 100, that is, a normal operation/training operation.

The master 101 may include a control logic (not illustrated) for controlling the slave 105 in association with the normal operation and training operation of the slave 105.

The control logic of the master 101 may include the form of a hardware or/and a software, and may perform an operation of outputting stored test data and an operation of generating and outputting a command/address C/A. The control logic of the master 101 may be configured to output a command/address C/A associated with the training operation, the reference data, and the test data.

The master 101 may include a transmitter (TX) 102 and a receiver (RX) 103. The transmitter 102 may include a delay circuit capable of changing a delay time.

The master 101 may adjust a data transmission timing by changing the delay time of the delay circuit of the transmitter 102.

The master 101 may receive determination result data transmitted from the slave 105, through the receiver 103.

The slave 105 may include a memory core 110, a control circuit 120, a first receiver 130, a transmitter 140, a second receiver 150 and a determination circuit 170.

The first receiver 130 may receive the data DQ transmitted through the data channel 107 from the master 101, depending on the reference voltage VREF, and may transmit the received data to the memory core 110.

The transmitter 140 may transmit data outputted from the memory core 110, to the master 101 through the data channel 107.

The second receiver 150 may receive the command/address C/A transmitted through the command/address channel 108 from the master 101, and may transmit the received command/address C/A to the control circuit 120.

The control circuit 120 may decode the command/address C/A, and thereby, may generate control signals ctrl for input/output of data and the reference voltage VREF.

The memory core 110 may include a plurality of unit memory regions, that is, a plurality of memory banks BK.

The memory core 110 may store data (for example, normal write data, reference data or/and test data) transmitted through the first receiver 130 in memory banks (for example, BKa and BKi) depending on the control signals ctrl, or may read data (normal read data, test data or/and determination result data) stored in a memory bank (for example, BKm) depending on the control signals ctrl and transmit the read data to an outside of the memory core 110.

The determination circuit 170 may generate determination result data by comparing the reference data and the test data respectively stored in the predetermined memory banks BKa and BKi of the memory core 110, and may store the generated determination result data in the predetermined memory bank BKm depending on the control signals ctrl. In an embodiment, the memory bank BKm may be the last memory bank in the memory core 210.

The determination circuit 170 represents only a configuration example, and, in the case where a test circuit such as a BIST (built-in self test) circuit or a parallel test circuit is included in the slave 105, a corresponding configuration may be used.

Figure 3:
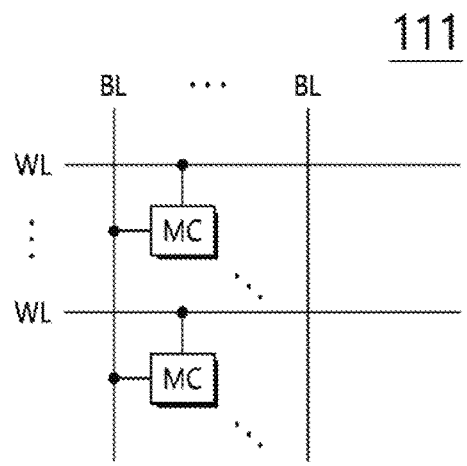
FIG. 3 is a diagram illustrating a representation of an example of the configuration of a memory bank of FIG. 2.

FIG. 3 is a diagram illustrating a representation of an example of the configuration of a memory bank of FIG. 2.

As illustrated in FIG. 3, a memory bank 111 may include a plurality of memory cells MC which are coupled to a plurality of word lines WL and a plurality of bit lines BL.

Figure 4:
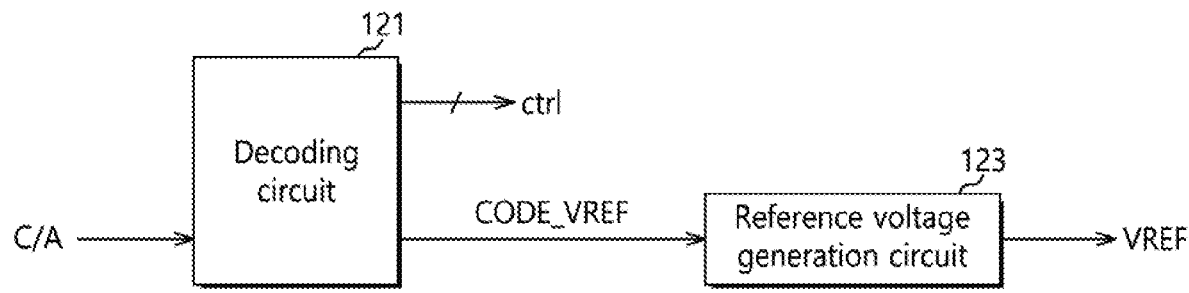
FIG. 4 is a diagram illustrating a representation of an example of the configuration of a control circuit of FIG. 2.

FIG. 4 is a diagram illustrating a representation of an example of the configuration of the control circuit 120 of FIG. 2.

As illustrated in FIG. 4, the control circuit 120 may include a decoding circuit 121 and a reference voltage generation circuit 123.

The decoding circuit 121 may decode the command/address C/A, and thereby, may generate the control signals ctrl and information for changing the reference voltage VREF, that is, a reference voltage code signal CODE_VREF.

The decoding circuit 121 may include a plurality of decoders for decoding the command/address C/A and thereby generating the control signals ctrl and the reference voltage code signal CODE_VREF.

The reference voltage generation circuit 123 may generate the reference voltage VREF based on the reference voltage code signal CODE_VREF, and the level of the reference voltage VREF may be adjusted depending on the reference voltage code signal CODE_VREF.

For instance, the reference voltage generation circuit 123 may include a digital-analog conversion circuit.

Figure 5:
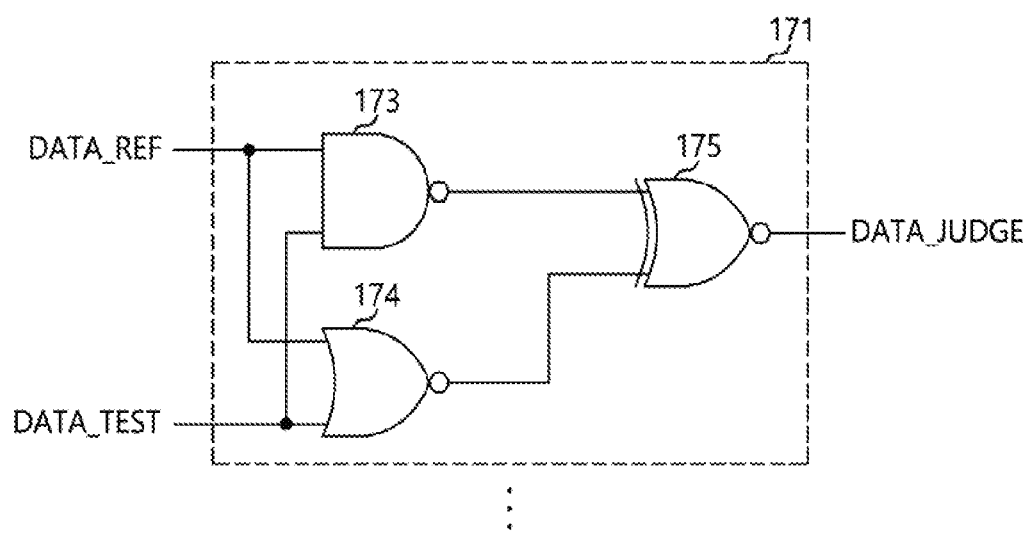
FIG. 5 is a diagram illustrating a representation of an example of the configuration of a determination circuit of FIG. 2.

FIG. 5 is a diagram illustrating a representation of an example of the configuration of the determination circuit 170 of FIG. 2.

Referring to FIG. 5, the determination circuit 170 may include at least one determination unit 171.

The determination unit 171 may include a first logic gate 173, a second logic gate 174 and a third logic gate 175.

The first logic gate 173 may perform a NAND logic function on reference data DATA_REF and test data DATA_TEST and output an output signal.

The second logic gate 174 may perform a NOR logic function on the reference data DATA_REF and the test data DATA_TEST and output an output signal.

The third logic gate 175 may perform an EXOR logic function on the output of the first logic gate 173 and the output of the second logic gate 174 and output determination result data DATA_DETERMINATION.

The reference data DATA_REF may have a target value without an error as it is transmitted at a low speed as described above.

If the value of the test data DATA_TEST is the same as the value of the reference data DATA_REF, the determination unit 171 may generate the determination result data DATA_DETERMINATION as the value of a logic high (or a logic low) meaning a pass.

If the value of the test data DATA_TEST is different from the value of the reference data DATA_REF, the determination unit 171 may generate the determination result data DATA_DETERMINATION as the value of a logic low (or a logic high) meaning a fail.

Figure 6:
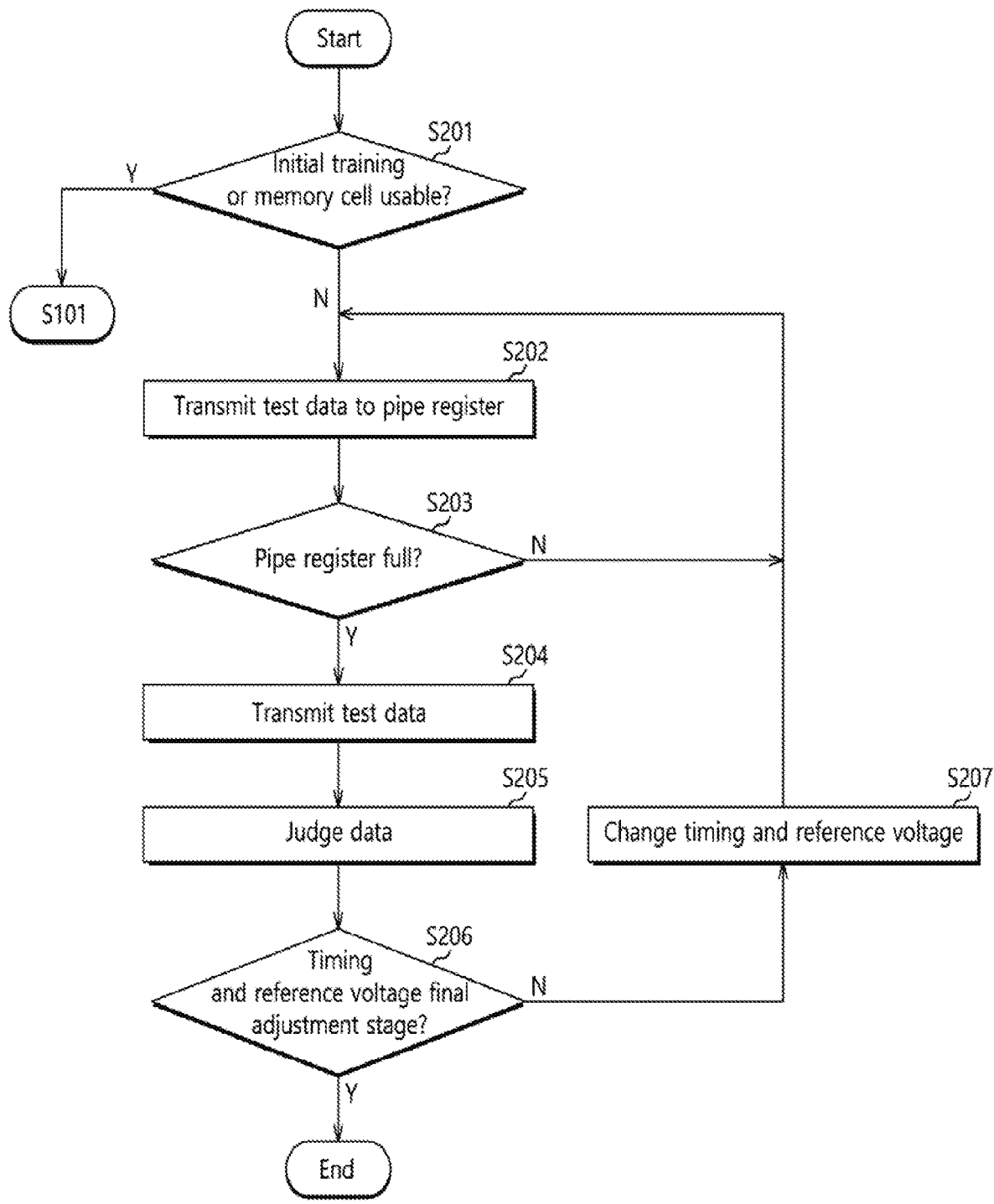
FIG. 6 is a representation of an example of a flow chart to assist in the explanation of a method for training a semiconductor system in accordance with another embodiment.

FIG. 6 is a representation of an example of a flow chart to assist in the explanation of a method for training a semiconductor system in accordance with another embodiment.

The master determines whether a current training operation is an initial training or whether a memory cell array may be used for a training operation (S201).

The determination of whether it is an initial training may be an operation of determining whether a training operation, for example, a write training operation, for the corresponding slave has not been performed before.

In the case where it is an initialing training, since no valid data is written in the memory cells of the slave, it is possible to write test data for the training.

By determining whether a memory cell array may be used for a training operation, in the case where, even though a training for the slave has already been performed, memory cells which currently do not have valid data, that is, extra memory cells capable of writing test data, are sufficient to be used for a training, among memory cells, test data for a training may be written by using the extra memory cells.

In the case where, as a determination result at the step S201, a current training operation is an initial training or a memory cell array may be used for a training operation, the training operation through the steps S101 to S110 described above with reference to FIG. 1 may be performed.

On the other hand, in the case where, as a determination result at the step S201, a current training operation is not an initial training or extra memory cells for a training operation do not exist, the master transmits data for a training, that is, test data, to a pipe register (S202).

The pipe register is a component which may be essentially used for data parallelization in the slave, and may be used for a training operation.

The master determines whether the pipe register is in a full state or whether there is a test data transmission request of the master (S203).

The master knows the depth of the pipe register and a data input/output processing scheme, for example, a burst length.

Thus, the master may know whether the pipe register is in a full state, depending on an amount (a bit number) of test data transmitted by itself.

As a determination result at the step S203, if the pipe register is not in a full state and there is not a test data transmission request of the master, the step S202 is repeatedly performed.

On the other hand, as a determination result at the step S203, if the pipe register is in a full state and there is a test data transmission request of the master, the test data stored in the pipe register is transmitted to the master (S204).

The master may determine a pass or a fail for the received test data (S205), and may detect the center of a data eye depending on a pass/fail determination result.

The master determines whether it is a final adjustment stage of adjusting a data transmission timing and a reference voltage (S206).

In the case where, as a determination result of the step S206, it is not a final adjustment stage of adjusting a data transmission timing and a reference voltage, the master changes a data transmission timing and a reference voltage (S207).

The master repeats the above-described steps S202 to S207 until a determination is performed for all predetermined test data.

In the case where, as a determination result of the step S206, it is a final adjustment stage of adjusting a data transmission timing and a reference voltage, the master may store a data transmission timing and a reference voltage corresponding to the detected center of the data eye, and, by setting them as a reference value for a subsequent normal operation, may end the training operation.

The data transmission timing and the reference voltage corresponding to the center of the data eye are stored, of course, in the master, and may be set as an operation reference of the slave by being stored in a mode register or the like of the slave.

In an embodiment, after an initial training, a training is not performed in such a way as to change a data transmission timing and a reference voltage through total preset ranges, and by performing a training operation through setting a data transmission timing and a reference voltage corresponding to the center of a data eye detected in a previous training operation, as a start point, it is possible to shorten a training time.

The above-described method for training a semiconductor system in accordance with an embodiment only represents an example in which all test data necessary for a training operation are collectively written without an intermediate read process. However, it is to be noted that the method for training a semiconductor system in accordance with an embodiment may include a scheme of repeatedly performing writes and reads by dividing all test data necessary for a training operation. In this connection, the amount of divided test data may be larger than the total memory capacity of the pipe register. The above-described scheme of repeatedly performing writes and reads by dividing all test data necessary for a training operation may be performed in consideration of a refresh operation of the semiconductor system. For instance, if a time required to collectively write all test data necessary for a training operation is within a data retention time, all the test data necessary for a training operation are collectively written, and if not, the scheme of repeatedly performing writes and reads by dividing all test data necessary for a training operation may be used.

In the method for training a semiconductor system in accordance with an embodiment, since test data is written in a memory bank, there is no substantial limit in capacity. Therefore, since it is not necessary to repeat a process in which a pass or a fail is determined by writing and reading only a part of entire test data and then a pass or a fail is determined again by writing and reading remaining test data, due to a limit in the capacity of the pipe register, a time required for a training may be shortened, and since test data is directly written in and read from a memory bank used in a normal operation, the reliability of a training operation may be improved. Moreover, even in the case where extra memory cells for a training do not exist after a first training operation, a second training operation using the pipe register is possible.

Hereinbelow, an embodiment of a semiconductor system for realizing the training method in accordance with an embodiment described above with reference to FIG. 6 will be described.

Figure 7:
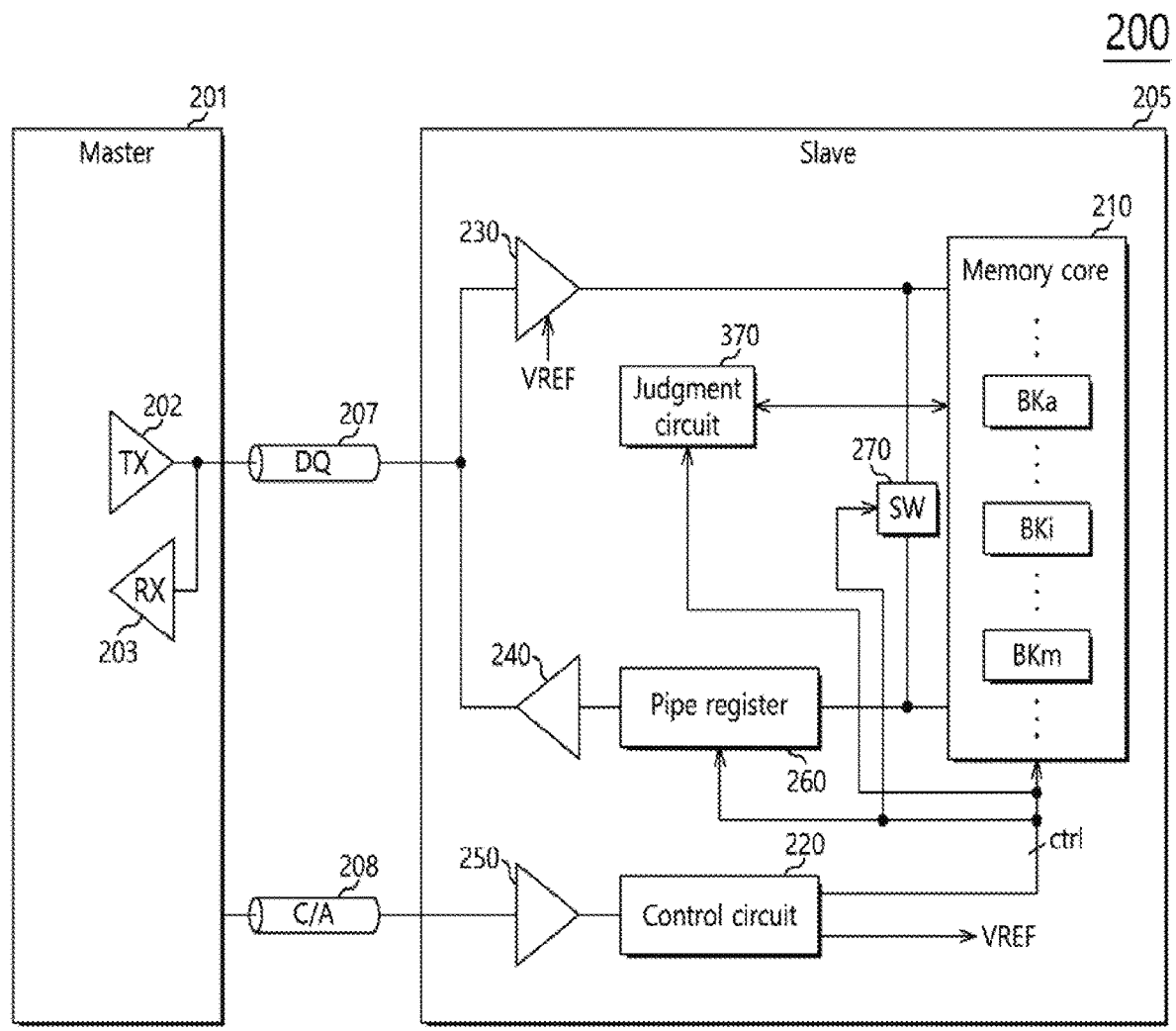
FIG. 7 is a diagram illustrating a representation of an example of the configuration of a semiconductor system in accordance with another embodiment.

FIG. 7 is a diagram illustrating a representation of an example of the configuration of a semiconductor system in accordance with another embodiment.

As shown in FIG. 7, a semiconductor system 200 in accordance with another embodiment may include a master 201 and a slave 205.

The master 201 may be configured to write reference data and test data in respective regions selected among a plurality of unit memory regions of the slave 205.

The master 201 may perform an operation of detecting the center of the data eye of determination result data provided from the slave 205.

The master 201 may include a memory controller such as a CPU or a GPU, and the slave 205 may include a semiconductor memory.

A data channel 207 and a command/address channel 208 may be coupled between the master 201 and the slave 205.

The master 201 and the slave 205 may transmit/receive data DQ through the data channel 207.

The master 201 may transmit a command/address C/A to the slave 205 through the command/address channel 208.

The master 201 may encode a command such as an active, write or read command, an address, an information associated with training control and information for changing a reference voltage VREF, in the command/address C/A.

The master 201 may encode different information in the command/address C/A depending on an operation state of the semiconductor system 200, that is, a normal operation/whether it is an initial training/whether extra memory cells for a training operation exist.

The master 201 may include a control logic (not illustrated) for controlling the slave 205 in association with the normal operation and training operation of the slave 205.

The control logic of the master 201 may include the form of a hardware or/and a software, and may perform an operation of outputting stored test data and an operation of generating and outputting a command/address C/A. The control logic may be configured to output a command/address C/A associated with the training operation, the reference data, and the test data.

The master 201 may include a transmitter (TX) 202 and a receiver (RX) 203. The transmitter 202 may include a delay circuit capable of changing a delay time.

The master 201 may adjust a data transmission timing by changing the delay time of the delay circuit of the transmitter 202.

The master 201 may receive determination result data transmitted from the slave 205, through the receiver 203.

The slave 205 may include a memory core 210, a control circuit 220, a first receiver 230, a transmitter 240, a second receiver 250, a pipe register 260, a data path switching circuit 270 and a determination circuit 370.

The first receiver 230 may receive the data DQ transmitted through the data channel 207 from the master 201, depending on the reference voltage VREF, and may transmit the received data to the memory core 210.

The transmitter 240 may transmit data outputted from the pipe register 260, to the master 201 through the data channel 207.

The second receiver 250 may receive the command/address C/A transmitted through the command/address channel 208 from the master 201, and may transmit the received command/address C/A to the control circuit 220.

The control circuit 220 may decode the command/address C/A, and thereby, may generate control signals ctrl and the reference voltage VREF.

The memory core 210 may include a plurality of memory banks BK.

The memory core 210 may store data transmitted from the first receiver 230 in memory banks depending on the control signals ctrl, or may read data stored in a memory bank depending on the control signals ctrl and transmit the read data.

The pipe register 260 is a component for parallelizing data outputted from the memory core 210 and outputting parallelized data.

The pipe register 260 may parallelize data outputted from the memory core 210 depending on the control signals ctrl and output the parallelized data.

The data path switching circuit 270 may couple or block a path that is directly coupled to the pipe register 260 from the master 201, depending on the control signals ctrl.

The determination circuit 370 may generate determination result data by comparing the reference data and the test data respectively stored in predetermined memory banks BKa and BKi of the memory core 210, and may store the generated determination result data in a predetermined memory bank BKm depending on the control signals ctrl.

The determination circuit 370 represents only a configuration example, and, in the case where a test circuit such as a BIST (built-in self test) circuit or a parallel test circuit is included in the slave 205, a corresponding configuration may be used.

The determination circuit 370 may be configured in the same manner as in FIG. 5.

The path that is directly coupled to the pipe register 260 from the master 201 is a path that is directly coupled to the pipe register 260 from the first receiver 230 without passing through the memory core 210.

In a normal operation of the semiconductor system 200, the data path switching circuit 270 may block the path that is directly coupled to the pipe register 260 from the master 201, depending on the control signals ctrl.

In the case where a training operation of the semiconductor system 200 is an initial training or extra memory cells for writing test data for a training operation exist, the data path switching circuit 270 may block the path that is directly coupled to the pipe register 260 from the master 201, depending on the control signals ctrl.

On the other hand, in the case where a training operation is not an initial training or extra memory cells for writing test data for a training operation do not exist, the data path switching circuit 270 may couple the path that is directly coupled to the pipe register 260 from the master 201, depending on the control signals ctrl.

In the semiconductor system 200 in accordance with another embodiment, the transmitter 202, the data channel 207, the command/address channel 208, the first receiver 230, the transmitter 240, the second receiver 250 and the memory core 210 may be configured in the same manner as the transmitter 102, the data channel 107, the command/address channel 108, the first receiver 130, the transmitter 140, the second receiver 150 and the memory core 110 of the semiconductor system 100 described above with reference to FIG. 2.

Figure 8:
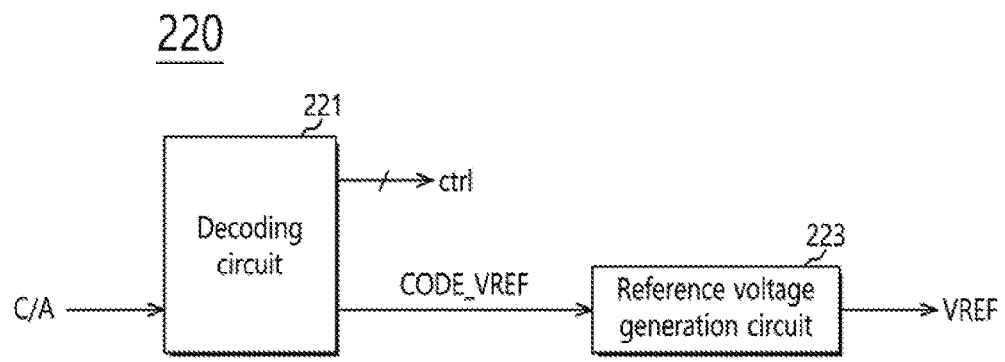
FIG. 8 is a diagram illustrating a representation of an example of the configuration of a control circuit of FIG. 7.

FIG. 8 is a diagram illustrating a representation of an example of the configuration of the control circuit 220 of FIG. 7.

As illustrated in FIG. 8, the control circuit 220 may include a decoding circuit 221 and a reference voltage generation circuit 223.

The decoding circuit 221 may decode the command/address C/A, and thereby, may generate information for changing the reference voltage VREF, that is, a reference voltage code signal CODE_VREF, and the control signals ctrl associated with training control.

The decoding circuit 221 may include a plurality of decoders for decoding the command/address C/A and thereby generating the reference voltage code signal CODE_VREF and the control signals ctrl.

The reference voltage generation circuit 223 may generate the reference voltage VREF of a level that is changed depending on the reference voltage code signal CODE_VREF.

The reference voltage generation circuit 223 may include a digital-analog conversion circuit.

While various embodiments have been described above, it will be understood to those skilled in the art that the embodiments described are examples only. Accordingly, the semiconductor systems with training functions described herein should not be limited based on the described embodiments.

What is claimed is:

1. A semiconductor system comprising:
   a slave and a master,
   wherein the slave comprises:
   a plurality of unit memory regions, and is configured to transmit determination result data generated by comparing reference data and test data, to the master;
   a first receiver configured to receive the reference data and the test data depending on a reference voltage;
   a transmitter configured to transmit data output from the plurality of unit memory regions, to the master;
   a second receiver configured to receive a command/address transmitted from the master;
   a control circuit configured to generate a reference voltage code signal by decoding the command/address, and change a level of the reference voltage; and
   a determination circuit configured to generate the determination result data by comparing the reference data and the test data; and
   wherein the master is configured to write the reference data and the test data in the plurality of unit memory regions.

2. The semiconductor system according to claim 1,
   wherein the plurality of unit memory regions comprise memory banks, and
   wherein each memory bank comprises a plurality of memory cells.

3. The semiconductor system according to claim 1, wherein a training operation is performed during an initialization period of the slave.

4. The semiconductor system according to claim 1, wherein a training operation is performed after a power-up of the slave, after a power-up of the slave and after a refresh operation, or after a power-up of the slave, after a refresh operation and upon a request of the master.

5. The semiconductor system according to claim 1, wherein the master is configured to write the reference data in a first unit memory region among the plurality of unit memory regions, and write the entire test data in a second unit memory region among the plurality of unit memory regions.

6. The semiconductor system according to claim 5, wherein the slave is configured to write the determination result data in a third unit memory region among the plurality of unit memory regions.

7. The semiconductor system according to claim 1, wherein the master comprises:
   a control logic configured to output a command/address associated with a training operation, the reference data and the test data;
   a transmitter configured to transmit the test data; and
   a receiver configured to receive the determination result data,
   wherein the transmitter comprises a delay circuit, and is configured to adjust a transmission timing of the test data by changing a delay time of the delay circuit.

8. A semiconductor system comprising:
   a slave and a master,
   wherein the slave comprises a plurality of unit memory regions and a pipe register for parallelizing data output from the plurality of unit memory regions, and is configured to transmit determination result data generated by determining whether test data is a pass or not, through comparing reference data and the test data, and
   wherein the master is configured to perform at least one of a first training operation of writing the reference data and the test data in the plurality of unit memory regions and detecting a center of a data eye of the determination result data and a second training operation of writing the test data in the pipe register, reading the test data and determining whether the read test data is a pass or not.

9. The semiconductor system according to claim 8,
   wherein the plurality of unit memory regions comprise memory banks, and
   wherein each memory bank comprises a plurality of memory cells.

10. The semiconductor system according to claim 8, wherein the first training operation an the second training operation are performed after a power-up of the slave, after a power-up of the slave and after a refresh operation, or after a power-up of the slave, after a refresh operation and upon a request of the master.

11. The semiconductor system according to claim 8, wherein the master is configured to write the reference data in a first unit memory region among the plurality of unit memory regions, and write the entire test data in a second unit memory region among the plurality of unit memory regions.

12. The semiconductor system according to claim 8, wherein the master is configured to divide the test data, and write the divided test data in at least one predetermined unit memory region among the plurality of unit memory regions.

13. The semiconductor system according to claim 12, wherein an amount of the divided test data is larger than a total memory capacity of the pipe register.

14. The semiconductor system according to claim 8, wherein the master is configured to perform the second training operation when an extra bank capable of storing the test data does not exist among the plurality of unit memory regions of the slave.

15. The semiconductor system according to claim 8, wherein the master comprises:
   a control logic configured to output a command/address, the reference data and the test data;
   a transmitter configured to transmit the test data; and
   a receiver configured to receive the determination result data,
   wherein the transmitter comprises a delay circuit, and is configured to adjust a transmission timing of the test data by changing a delay time of the delay circuit.

16. The semiconductor system according to claim 8, wherein the slave comprises:
   a first receiver configured to receive the reference data and the test data depending on a reference voltage, and transmit them to the plurality of unit memory regions;
   a data path switching circuit configured to couple or block a path that is directly coupled to the pipe register from the first receiver, depending on control signals;

a transmitter configured to transmit data outputted from the pipe register, to the master;

a second receiver configured to receive a command/address transmitted from the master;

a control circuit configured to generate the control signals and the reference voltage by decoding the command/address; and a determination circuit configured to generate the determination result data by comparing the reference data and the test data.

17. The semiconductor system according to claim 16, wherein, in the first training operation, the data path switching circuit blocks the path that is directly coupled to the pipe register from the first receiver, depending on the control signals.

18. The semiconductor system according to claim 16, wherein, in a normal operation, the data path switching circuit blocks the path that is directly coupled to the pipe register from the first receiver, depending on the control signals.

19. The semiconductor system according to claim 16, wherein, in the second training operation, the data path switching circuit couples the path that is directly coupled to the pipe register from the first receiver, depending on the control signals.

* * * * *